(12) United States Patent
Yudasaka et al.

(10) Patent No.: US 6,514,801 B1
(45) Date of Patent: Feb. 4, 2003

(54) METHOD FOR MANUFACTURING THIN-FILM TRANSISTOR

(75) Inventors: Ichio Yudasaka, Chimo; Tatsuya Shimoda; Shunichi Seki, both of Nagano-ken, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/701,511

(22) PCT Filed: Mar. 29, 2000

(86) PCT No.: PCT/JP00/09185

§ 371 (c)(1),
(2), (4) Date: Nov. 30, 2000

(87) PCT Pub. No.: WO00/59040

PCT Pub. Date: Oct. 5, 2000

(30) Foreign Application Priority Data

Mar. 30, 1999 (JP) ............................................. 11-90310

(51) Int. Cl.⁷ .......................... H01L 21/00; H01L 21/84
(52) U.S. Cl. ........................................ 438/151; 438/166
(58) Field of Search .................... 438/151, 166, 438/485, 486, 785, 907, 908, 963, 973, 152, 155, 162, 660

(56) References Cited

U.S. PATENT DOCUMENTS

| | | | |
|---|---|---|---|
| 5,500,537 A | * | 3/1996 | Tsumura et al. .............. 257/40 |
| 5,851,860 A | * | 12/1998 | Makita et al. .............. 438/166 |
| 5,959,313 A | * | 9/1999 | Yamazaki et al. ............ 257/59 |
| 5,989,945 A | | 11/1999 | Yudasaka et al. ........... 438/169 |
| 6,235,563 B1 | * | 5/2001 | Oka et al. .................. 438/166 |
| 6,255,706 B1 | * | 7/2001 | Watanable et al. .......... 257/412 |

FOREIGN PATENT DOCUMENTS

| | | |
|---|---|---|
| GB | 2 077 710 A | 12/1981 |
| JP | A-7-267621 | 10/1975 |
| JP | 63043323 | 2/1988 |
| JP | A-64-29661 | 1/1989 |
| JP | 3102324 | 4/1991 |
| JP | 3217821 | 9/1991 |
| JP | 3268426 | 11/1991 |
| JP | 4-81820 | 3/1992 |
| JP | 4106954 | 4/1992 |
| JP | A-4-334551 | 11/1992 |
| JP | 5116941 | 5/1993 |
| JP | 5-144741 | 6/1993 |
| JP | 5234432 | 9/1993 |
| JP | A-5-259154 | 10/1993 |
| JP | 5259154 | 10/1993 |
| JP | 6088774 | 3/1994 |
| JP | 6120351 | 4/1994 |
| JP | 6120357 | 4/1994 |
| JP | 6175144 | 6/1994 |
| JP | 6324352 | 11/1994 |
| JP | 7201724 | 5/1995 |
| JP | 7188593 | 7/1995 |
| JP | 7230099 | 8/1995 |
| JP | 7267621 | 10/1995 |
| JP | 8032085 | 2/1996 |
| JP | 8083965 | 3/1996 |
| JP | 9-45922 | 2/1997 |
| JP | 10-161140 | 6/1998 |
| JP | 11-8395 | 1/1999 |

OTHER PUBLICATIONS

Kern, et al., J. Vac. Sci Technology, vol. 14, pp. 1082–1099 (1977).

(List continued on next page.)

Primary Examiner—David Nelms
Assistant Examiner—Phuc T. Dang
(74) Attorney, Agent, or Firm—Oliff & Berridge, PLC (57) ABSTRACT

All or a part of the thin films such as a silicon film, an insulation film and a conductive film constituting the thin film transistor is formed using a liquid material. The method mainly consist of the steps of: foaming a coating film by coating a substrate with the liquid material; and forming a thin film with a desired thickness by heat-treating the coating film.

36 Claims, 4 Drawing Sheets

OTHER PUBLICATIONS

Spear, et al., Solid State Com., vol. 17, pp. 1193–1196(1975).

Bianconi, et al., J. Am. Chem. Soc., 110, pp. 2342–2344 (1988).

Furukawa, et al., Macromolecules, 23, pp. 3423–2426 (1990).

Mikami, Koichi et al., "Anomalous threo–Diastereoselectivity in Allylic Silane– or Stannane–Aldehyde Condensation Reactions: New Interpretation of the Antiperiplanar vs. Synclinal Problem on the Transition–state Conformations", *J. Chem. Soc., Chem. Commun.*, 1990, pp. 1161–1163.

Manning, Anthony R. et al., "The Systematic Synthesis of Complexes containing $\mu_3$–CS Ligands as Two–electron Donors. The Preparation and Structure of [{Co($\eta$–C$_5$H$_5$)}$_2${Fe(PPh$_3$)(CO)$_2$}($\mu_3$–S)($\mu_3$–CS)]", *J. Chem. Soc., Chem. Commun.*, 1992, pp. 897–898.

Sakamoto, Kenkichi et al., "Highly Ordered High Molecular Weight Alternating Polysilylene Copolymer Prepared by Anionic Polymerization of Masked Disilene", *Macromolecules*, vol. 23, 1990, pp. 4494–4496.

Hengge, Edwin et al., "Darstellung und Charakterisierung von Cyclohexasilan Si$_6$H$_{12}$", *Z. anorg. allg. Chem.*, vol. 459, 1979, pp. 123–130.

Hengge, Edwin et al., "Darstellung und Eigenschaften von Cyclopentasilan", *Monatshefte für Chemie*, vol. 106, 1975, pp. 503–512.

Stüger, Harald et al., "Anorganische Bi(cyclopentasilanyle): Synthese und spektroskopische Charakterisierung", *Z. anorg. allg. Chem.*, vol. 621, 1995, pp. 1517–1522.

Boudjouk, Philip et al., "The Synthesis of the First Spiropentasilane, Octamethylspiropentasilane", *J. Chem. Soc., Chem. Commun.*, 1984, pp. 777–778.

* cited by examiner

METHOD FOR MANUFACTURING THIN-FILM TRANSISTOR

BACKGROUND OF THE INVENTION

1. Field of the Invention

The present invention relates to a method for manufacturing thin film transistor to be used for liquid crystal display devices, auto-luminescent display devices and LSIs. In more detail, the present invention relates to a method for manufacturing a thin film transistor by forming a thin film constituting the thin film transistor using a liquid material.

2. Description of Related Art

A thin film transistor is usually composed of thin films such as semiconductor films, insulation films and conductive films. When these thin films are categorized depending on their functions, the insulation films include gate insulation films and interlayer insulation films, and the conductive films are used for gate electrodes, source/drain electrodes, pixel electrodes and wiring lines. These thin films have been mainly deposited by a CVD (Chemical Vapor Deposition) method and a sputtering method.

Silicon films such as amorphous silicon films and poly-silicon films have been mainly used for the semiconductor films. The silicon films have been usually formed by a thermal CVD method, a plasma CVD method or a photo-CVD method using monosilane gas or disilane gas. The thermal CVD method has been generally used for depositing the poly-silicon film (J. Vac. Sci. Technology, vol. 14, p1082 (1977)), while the plasma CVD method has been widely used for depositing the amorphous silicon (Solid State Com., vol. 17, p1193 (1975)).

SUMMARY OF THE INVENTION

The silicon film formed by the CVD method have involved some problems to be improved in the manufacturing process: (1) manufacturing yield is low due to contamination of the manufacturing apparatus and generation of foreign substances, since silicon particles appear in the gas phase to be used for the gas phase reaction, (2) a silicon film with a uniform thickness cannot be deposited on a substrate having a rough surface, since a gaseous starting material is used, (3) a step for heating the substrate is required, and productivity is low due to a slow deposition rate of the film, and (4) a complicated and expensive microwave generator and an evacuation apparatus are necessary in the plasma CVD method.

Handling of highly reactive gaseous silicon hydride to be used as a starting material is difficult, besides requiring an air-tight evacuation apparatus as well as a pollutant elimination apparatus for the treatment of exhaust gases. Not only such large scale facility itself is expensive, but also a large amount of energy is consumed in the vacuum system and plasma system, rendering the product a high manufacturing cost.

A method for coating liquid silicon hydride that is free from the vacuum system has been proposed in recent years. Japanese Unexamined Patent Application Publication No. 1-29661 discloses a method for forming a silicon thin film by allowing a gaseous material to be liquefied and absorbed on a chilled substrate as a liquid, followed by allowing the substrate to react with chemically active atomic hydrogen. However, the method also involves a problem that a complicated apparatus is required for continuously evaporating and liquefying silicon hydride, and control of the film thickness is difficult (1).

While Japanese Unexamined Patent Application Publication No.7-267621 discloses a method for coating the substrate with low molecular weight liquid silicon hydride, on the other hand, handling of this complex system is so troublesome that it is difficult to obtain a uniform film thickness when applied to a large area substrate.

While an example of a solid silicon hydride polymer has been reported in UK Patent GB-2077710A, it is impossible to form a film by coating since the compound is insoluble in solvents.

The thermal CVD method, plasma CVD method and sputtering method have been widely used for forming a gate insulation film used for thin film transistors, an insulation film for the interlayer insulation firm, and an electrode conductive film for the gate electrode and source/drain electrodes. The conductive film to be used for the thin film transistor is used for the gate electrode source/drain electrodes wiring lines for connecting among the electrodes, and wiring lines for a power circuit, and a metal film such as Al, Cu, Cr or Ta film is used as the conductive film. The conventional sputtering method is widely used for forming the metal film and siliside film. While a transparent conductive film in addition to the foregoing conductive film is required for the thin film transistor to be used for a liquid crystal display device, an ITO film is usually used for the transparent conductive film, which is deposited by the sputtering method as used in forming the metal film.

The CVD method involves the following four features, which are the same as those in forming the silicon film as an insulation film: (1) manufacturing yield is low due to contamination of the manufacturing apparatus and generation of foreign substances, since silicon particles appear in the gas phase to be used for the gas phase reaction, (2) a silicon film with a uniform thickness can not be deposited on a substrate having a rough surface, since a gaseous starting material is used, (3) a step for heating the substrate is required, and productivity is low due to a slow deposition rate of the film, and (4) a complicated and expensive microwave generator and an evacuation apparatus are necessary in the plasma CVD method.

An evacuation apparatus, in addition to a vacuum pump as well as a target material, a sputtering power source and a substrate heating apparatus, are required for the sputtering method to be utilized in forming the conductive film mainly comprising a metal film and the transparent conductive film. Although a toxic and combustible gas is seldom used in the sputtering method as compared with the CVD method, the film is deposited not only on the substrate as a film deposition object but also on the inner wall of the chamber in which the substrate is placed. Peeled pieces of the deposition material from the inner wall serve as foreign substances during the film deposition process to result in decreased manufacturing yield of the product as in the CVD method. It is the common drawbacks of the sputtering method with the CVD method that the film thickness is uneven at the rough portions on the surface of the substrate, productivity is low, and the facilities become large scale and expensive because an evacuation apparatus is required.

The method for forming the thin film by the conventional CVD method and sputtering method have involved the problems of low productivity, high incidence of film defects and low yield, uneven film thickness at the rough surface portions, and breakage of wiring patterns at the steps. These problems also cause increased manufacturing cost of the thin film transistor. These problems in the CVD method and sputtering method arise from intrinsic features of the film deposition method such as use of the evacuation apparatus, need of heating of the substrate, requirement of a power source for plasma generation, and film deposition on unnecessary portions such as the inner wall of the apparatus other than the substrate. These intrinsic features arise other problems that the large scale apparatus leads to a high facility cost, and the running cost of the apparatus is also high.

The present invention proposes a method for manufacturing a thin film transistor by a novel method essentially different from the conventional film deposition method. While the thin films such as a silicon film and an insulation film in the thin film transistor have been deposited by a CVD method or a sputtering method, a desired thin film is formed in the present invention by coating a substrate with a liquid material to form a coating film, followed by heat-treating the coating film.

The object of the present invention is to provide a method for solving the intrinsic problems involved in the conventional film deposition method, providing a method for manufacturing a thin film transistor with a low manufacturing cost using a compact and cheap apparatus for forming a thin film with high productivity, less incidence of film defects, high manufacturing yield, small number of wiring breakage at the steps, and low manufacturing cost.

All or a part of the thin films such as the silicon film, insulation film and conductive film constituting the thin film transistor are formed using a liquid material in the present invention for solving the foregoing problems. The method mainly comprises the steps of: forming a coating film by coating a substrate with the liquid material; and forming a desired thin film by heat-treating the coating film.

In a first aspect of the method for manufacturing a thin film transistor, the silicon film is formed by the steps comprising: forming a coating film by coating a liquid material containing silicon atoms; and heat-treating and/or irradiating a light for converting the coating film into the silicon film.

In the first aspect so configured as described above, the heat treatment step desirably comprises a first heat-treatment step for converting the coated liquid material into an amorphous silicon film, and a second heat treatment step for converting the amorphous silicon film into a polycrystalline silicon film.

Preferably, the liquid material containing silicon atoms contains a silicon compound having a cyclic group represented by a general formula of $Si_nX_m$ (wherein n represents an integer of 5 or more, m represents an integer of n, 2n–2 or 2n, and X represents a hydrogen atom and/or a halogen atom) in the first aspect described above.

It is desirable that n is an integer in the range of 5 or more and 20 or less in the silicon compound having a cyclic group represented by the general formula of $Si_nX_m$ in the silicon compound having a cyclic group represented by a general formula of $Si_nX_m$ (wherein n represents an integer of 5 or more, m represents an integer of n, 2n–2 or 2n, and X represents a hydrogen atom and/or a halogen atom) in the first aspect described above.

It is also desirable that the solute concentration of the solution containing the silicon compound having a cyclic group represented by the general formula of $Si_nX_m$ is in the range of 1 to 80% by weight.

It is also desirable that the solution containing the silicon compound having a cyclic group represented by the general formula of $Si_nX_m$ has a viscosity of 1 to 100 mPa·s.

It is also desirable that the solution containing the silicon compound having a cyclic group represented by the general formula of $Si_nX_m$ has a vapor pressure of 0.001 to 100 mgHg at room temperature.

It is also desirable that hydrocarbons are used for the solvent for the solution containing the silicon compound having a cyclic group represented by the general formula of $Si_nX_m$.

In a second aspect, the present invention provides a method for manufacturing a thin film transistor formed on an insulation substrate or insulation film, comprising the steps of: forming a coating film by coating a liquid material containing silicon atoms; and heat-treating for converting the coating film into the silicon film, the step for forming the gate insulation film and interlayer insulation film comprising the steps of coating the substrate with polysilazane, and converting coated polysilazane into an $SiO_2$ film by heat-treatment.

In a third aspect, the present invention provides a method for manufacturing a thin film transistor formed on an insulation substrate or insulation film, comprising the steps of: forming a coating film by coating a liquid material containing silicon atoms on the substrate; and heat-treating for converting the coating film into a silicon film, the step for forming the a gate electrode and source/drain electrode comprising forming a coating film by coating a liquid material containing a metal on the substrate, converting the coating film into a conductive film by heat-treatment, and patterning the conductive film.

It is preferable in the third aspect that the gate electrode and the source/drain electrodes are formed by forming a conductive film on the substrate by plating, followed by patterning the conductive film.

It is preferable in the third aspect that the gate electrode and source/drain electrodes are formed by the steps comprising: forming a conductive film on the substrate by plating; and patterning the conductive film.

It is preferable in the third aspect that the gate electrode and source/drain electrode are formed by the steps comprising: forming a coating film by coating an organic compound containing indium and tin; and heat-treating for converting the coating film into an ITO (Indium-Tin-Oxide) film.

In a fourth aspect, the present invention provides a method for manufacturing a thin film transistor formed on an insulation substrate or insulation film, comprising the steps of: forming a coating film by coating a liquid material containing silicon atoms on the substrate; heat-treating for converting the coating film into a silicon film, the step for forming a transparent conductive film comprising forming a coating film by coating an organic compound containing indium and tin; and heat-treating for converting the coating film into an ITO (Indium-Tin-Oxide) film.

In a fifth aspect, the present invention provides a method for manufacturing a thin film transistor formed on an insulation substrate or insulation film, comprising the steps of: forming a coating film by coating a liquid material containing silicon atoms on an insulation substrate or insulation film; heat-treating for converting the coating film into a silicon film; forming an islet region that serves as a source, drain and channel by patterning the silicon film; forming a gate insulation film; forming a gate electrode; injecting impurities into the source/drain regions; forming an interlayer insulation film; opening contact holes on the interlayer insulation film; and forming electrodes and wiring lines.

In a sixth aspect, the present invention provides a method for manufacturing a thin film transistor formed on an insulation substrate or insulation film, comprising the steps of: forming a semiconductor layer that serves as a source/drain regions on am insulation substrate or insulation film; forming a coating film by coating a liquid material containing silicon atoms on the substrate; heat-treating for converting the coating film into a silicon film; forming an islet region that serves as a channel region to be connected to the source/drain regions by patterning the silicon film; forming a gate insulation layer; forming a gate electrode; forming an interlayer insulation film; opening contact holes on the interlayer insulation film; and forming electrodes and wiring lines.

In a seventh aspect, the present invention provides a method for manufacturing a thin film transistor formed on an insulation substrate or insulation film, comprising the steps of forming a gate electrode on an insulation substrate or insulation film; forming a gate insulation layer; forming a coating film by coating a liquid material containing silicon atoms on the substrate; heat-treating for converting the coating film into a silicon film; forming a semiconductor layer that serves as source/drain regions; and forming electrodes and wiring lines.

In a eighth aspect, the present invention provides a method for manufacturing a thin film transistor comprising thin films of a silicon film, an insulation film and a conductive film, wherein all the thin films are formed using a liquid material, and the method for forming the thin films comprises no evacuation apparatus.

In a different aspect, the present invention provides a method for manufacturing a thin film transistor comprising thin films of a silicon film, a gate insulation film, a gate electrode conductive film, an interlayer insulation film, a conductive film for electrodes and wiring lines, and a transparent conductive film, wherein all the thin films are formed using a liquid material, and the method for forming the thin films comprises no evacuation apparatus.

DETAILED DESCRIPTION OF THE EMBODIMENTS

Thin films constituting a thin film transistor many consist of a silicon film, an insulation film and a conductive film, and a transparent conductive film is used as an additional thin film in the thin film transistor to be used for a liquid crystal display device. These thin films have been mainly formed by a CVD method or a sputtering method. However, the thin films formed by the conventional CVD method and sputtering method involved the problems of low productivity, high incidence of film defects and poor manufacturing yield, uneven film thickness at rough portions on the surface, and breakage of wiring patterns at the steps. These problems result in a coat-up of the thin film transistor manufactured by the method as described above. These problems in the CVD method and sputtering method arise from intrinsic features of these film deposition methods such as using an evacuation apparatus, requiring a substrate heating device, requiring a power source for generating plasma, and causing film defects due to foreign materials formed by peeling films formed on excess portions on the inner wall of the apparatus other than the substrate. These intrinsic features also involve the problems of large scale facilities to increase the facility cost, and high running cost of the apparatus.

Figure 3:
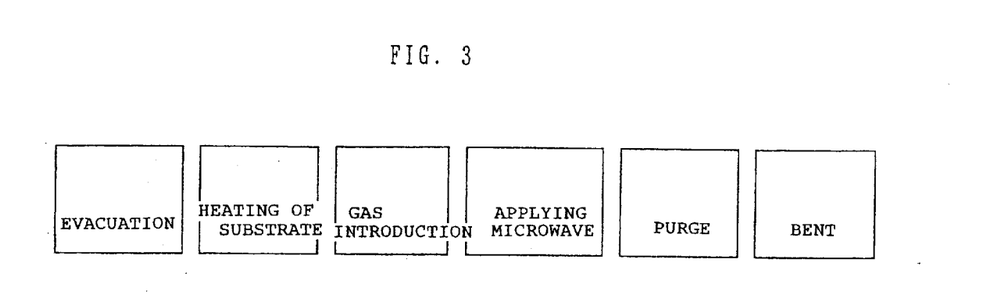
FIG. 3 shows the process for forming thin films by the conventional CVD method.

FIG. 3 shows a standard manufacturing process for film deposition by the conventional CVD method. The substrate placed in a CVD apparatus is evacuated after being transferred into a load-lock chamber, and is heated after being transferred into a heating chamber, followed by film deposition by being transferred into a process chamber. The process chamber has a heating mechanism for maintaining the temperature of the substrate. A microwave is applied for forming a plasma of an introduced gas for film deposition by applying the microwave after the gas pressure has been stabilized. The remaining gas is purged after the film deposition, and the substrate is transferred into the load-lock chamber to take out into the air after supporting with a bent. Since the process gas to be used in the CVD method mostly may consist of a toxic or combustible gas, a gas-leak sensor and a pollutant elimination apparatus for rendering the exhaust gas harmless should be installed for safety control of the CVD apparatus. The toxic or combustible gas should be thoroughly purged in the gas-purge step, forcing to waste a long time before completing the film deposition process.

Films are deposited in the sputtering method by an almost the same treatment step as in the CVD method as shown in FIG. 3. The sputtering method differs from the CVD method in that an inert gas such as Ar is mostly used and toxic and combustible gases are seldom used, and a DC power source is used, instead of the microwave. However, these are slight differences in comparison with the entire manufacturing process and constitution of the apparatus for forming the thin film as a whole. The sputtering method also involves the same problems as those in the CVD method in that the apparatus has a large size and the productivity is low.

On the contrary, the thin film is formed starting from liquid materials. The major process may consist of forming a coating film of the liquid material on a substrate, and heat-treating for converting the coating film into a functional film. The coating film is formed by a spin-coat method, roll-coat method, curtain-coat method, dip-coat method, spray method and ink-jet method. The structure of a coating apparatus to be used for these methods is quite simple because it is basically composed of a stage or a holder for holding the substrate, and a mechanism for coating a liquid on the substrate. While the apparatus used in a heat-treatment step and/or light irradiation step may consist of a heat-treatment apparatus such as an oven, a baking furnace and an annealing furnace, and a light irradiation apparatus using a halogen lamp or UV lamp as a light source, this apparatus has also a very simple structure.

Figure 1:
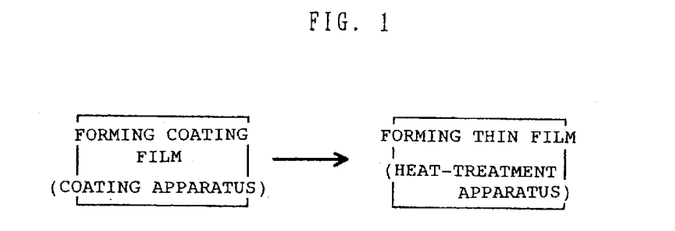
FIG. 1 shows a process for forming thin films using a liquid material.
Figure 2:
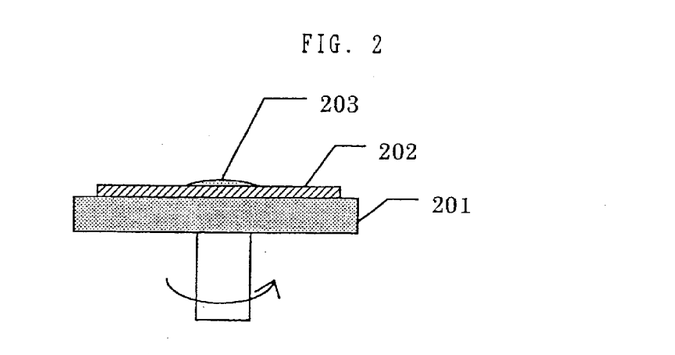
FIG. 2 shows coating films formed using a liquid material.

FIG. 1 shows one embodiment of the method for forming a thin film from a liquid material according to the present invention. While control of the atmosphere is required in the steps for coating the film and for forming the thin film depending on the liquid material to be used, the process is basically carried out in the air. One may recognize how simple is the method for forming the thin film according to the present invention, in comparison with the film deposition steps by the conventional CVD method and sputtering method. In the apparatus for forming the coating film by the spin-coat method shown in FIG. 2, only a stage 201 capable of rotating, and a dropwise addition mechanism of the liquid material 203 on the substrate 202 are necessary. A heating device may consist of a stage or holder on which the substrate is placed, and a heating mechanism. Accordingly, it may be understood that the apparatus to be used in the present invention is compact and cheap as compared with the conventional CVD and sputtering apparatus.

The present invention is able to solve the intrinsic problems of the conventional film deposition method, making it possible to form the thin film with low cost, and to manufacture a low cost thin film transistor with higher productivity, smaller incidence of film defects, higher manufacturing yield, and good coverage of the steps.

As hitherto described, all or a part of the thin films of the silicon film, insulation film and conductive film are formed using the liquid material in the method for forming the thin film transistor according to the present invention. While the basic process may consist of forming the coating film by coating the liquid material on the substrate, and converting the coating film into a thin film by heat-treatment, a step for forming a desired thin film on the surface of the substrate by dipping the substrate in the liquid material may be included in the process. The spin-coat method, roll-coat method, curtain-coat method, dip-coat method and ink-jet method may be used for forming the coating film on the substrate.

Silicon compounds involved in the liquid material to be used in the present invention for forming the silicon film are represented by a general formula of $Si_nX_m$ (wherein n represents an integer of 5 or more, m represents an integer of n, 2n−2 or 2n, and X represents a hydrogen atom and/or a halogen atom).

The integers n and m in the silicon compound represented by the general formula of $Si_nX_m$ are preferably 5 or more and 20 or less, and 5 or 6, respectively. Handling of the silicon compound becomes difficult due to distortion of its cyclic structure when n is smaller than 5, while selection range of the practically available solvents becomes narrow due to decreased solubility of the silicon compound ascribed to the aggregation force when n is larger than 20.

Examples of the monocyclic silicon compounds represented by the general formula above include cyclopentasilane, silylcyclopentasilane, cyclohexasilane, cylylcyclohexacylane, and cycloheptasilane, and examples of the bicyclic silicon compounds include 1,1'-biscyclobutasilane, 1,1'-biscyclopentasilane, 1,1'-biscyclohexasilane, 1,1'-biscycloheptasilane, 1,1'-cyclobutasilylcyclopantasilane, 1,1'-cyclobutasilyl-cyclohexasilane, 1,1'-cyclobutasilylcyclohcptasilane, 1,1'-cyclopentasilylcyclohexasilane, 1,1'-cyclopentasilylcycloheptasilane, 1,1'-cyclohexasilyl-cycloheptasilane, spiro[2,2]pentasilane, spiro[3,3]-heptasilane, spiro[4,4]nonasilane, spiro[4,5]decasilane, spiro[4,6]undecasilane, sporo[5,5]undecasilane, spiro[5,6] dodecasilane, spiro[6,6]tridecasilane.

Examples of polycyclicsiliconcompounds include silicon hydride compounds of the compounds 1 to 5 shown below:

Compound 1

Compound 2

Compound 3

Compound 4

Compound 5

Other examples other than the silicon compounds described above include silicon compounds in which hydrogen atoms in the frame structure are partially substituted with $SiH_3$ groups or halogen atoms. A mixture of two or more of these compounds may be used. Particularly preferable from the point of solubility in solvents are 1,1'-biscyclopentasilane, 1,1'-biscyclohexasilane, spiro[4,4] nonasilane, spiro[4,5]decasilane, spiro[5,5]undecasilane and spiro[5,6]dodecasilane, and silicon compounds having $SiH_3$ groups in their frame.

While a solution essentially containing a silicon compound having a cyclic group represented by the general formula of $Si_nX_m$ is used for forming the silicon film according to the present invention, the solution may contain other silicon compounds such as n-pentasilane, n-hexasilane and n-heptasilane.

The silicon compound to be used in the present invention can be manufactured by the following methods using a monomer having a corresponding structural unit as a starting material.

(a) A dehalogenation condensation polymerization of halosilancs in the presence of an alkali metal, so-called Kipping's method [J. Am. Chem. Soc., 110, 2342 (1988); Macromolecules, 23, 3423(1990)];

(b) A dehalogenation condensation polymerization of halosilanes by an electrode reduction [J. Chem. Soc., Chem. Commun., 1161(1990); J. Chem. Soc., Chem. Commun., 897(1992)];

(c) A dehydrogen condensation polumerization of hydrosilanes in the presence of a metallic catalyst (Japanese Unexamined Patent Application Publication No. 4-334551);

(d) An anion polymerization of disilene cross-inked with biphenyl [Macromolecules, 23, 4494(1990)]; and (e) After synthesizing the cyclic silicon compound substituted with a phenyl group or alkyl group by the method described above, the product may be converted into compounds substituted with a hydroxyl group or halogen atom by a method known in the art [for example, Z. anorg. allg. Chem., 459, 123–130(1979)]. These halogenated cyclosilane compounds can be synthesized by a method known in the art [for example, E. Hengge et al., Mh. Chem. vol. 10, p503 (1975); E. Hengge et al., Z. anorg. allg. Chem., vol. 621, p1517(1995); P. Boudjouk et al., J. Chem. Soc., Chem. Commun. P777 (1984)], and a chlorinated compound, hydrogenated compound and partially chlorinated compound may be used by optimizing the synthetic conditions.

A solution prepared by dissolving the silicon compound represented by the general formula $Si_nX_m$ is coated on the substrate in the present invention. The solvent to be used in the present invention usually has a vapor pressure in the range of 0.001 to 200 mmHg at room temperature. It may be sometimes difficult to form a good coating film when the vapor pressure is higher than 200 mmHg, because the solvent evaporates earlier before forming the coating film. When the vapor pressure is lower than 0.001 mmHg, on the other hand, drying of the coating film is so slow that the solvent is liable to be remained in the coating film, thereby making it difficult to obtain a good quality silicon film after the heat treatment and/or light irradiation treatment. The solvents to be used in the present invention are not particularly restricted provided that they do not react with the silicon compound. Examples of the solvents include hydrocarbon solvents such as n-hexane, n-heptane, n-octane, n-decane, dicyclopentane, benzene, toluene, xylene, dulene, indene, tetrahydronaphthalene, decahydronaphthalene, and squalene; ethers such as dipropylether, ethyleneglycol dimethylether, ethyleneglycol diethylether, ethyleneglycol methylethylether, diethyleneglycol dimethylether, ethyleneglycol diethylether, diethyleneglycol methylethylether, tetrahydroframn, 1,2-diethoxycthane, bis(2-methoxyethyl) ether, and p-dioxane; and polar solvents such as propylene carbonate, g-butyrolactone, N-methyl-2-pyrrolidone, N-methyl-2-pyrrolidone, dimethylformamide, acronitrile, dimethylsulfoxide, and chloroform. Hydrocarbon solvents and ether based solvents are preferable among them in view of solubility of the silicon compounds and modified silicon compounds, and more preferable solvents are the hydrocarbon solvents. These solvents may be used alone or as a mixture thereof. The hydrocarbon solvents are particularly suitable since they can improve solubility of the silicon compounds besides suppressing the amount of residual silicon compounds in the heat treatment or light irradiation treatment to be described hereinafter.

Feeding of a gas is not required in the method for forming the silicon film according to the present invention, as in the conventional CVD method. After coating the silicon compound dissolved in a solvent on the substrate, the solvent is dried to form a film of the silicon compound, followed by converting the silicon compound film into a metallic silicon film by heat-decomposition or photolysis. The method to be used for coating the solution of the silicon compound include a spin-coat method, roll-coat method, curtain-coat method, dip-coat method, spray method and ink-jet method. The solution is usually coated at room temperature, because a part of the solute may precipitate at a temperature below the room temperature due to decreased solubility of the silicon compound. The solution is preferably coated in an inert gas atmosphere such as nitrogen, helium and argon. A reducing gas such as hydrogen may be preferably mixed in the atmosphere if necessary.

While the rotational speed of a spinner when the spinner is used is determined by the thickness of the thin film to be formed and the composition of the coating solution, it is usually 100 to 5000 rpm and preferably 300 to 3000 rpm. A heating treatment is applied for removing the solvent after coating. While the heating temperature is different depending on the kind and boiling point (vapor pressure) of the solvent it is usually 100 to 200° C. The same atmosphere such as helium and argon as used in the coating step is also preferably used for drying.

The silicon compound is converted into the silicon film by treating with heat or light in the present invention. While the silicon film obtained in the present invention is amorphous or polycrystalline, an amorphous silicon film or polycrystalline silicon film can be obtained by a heat treatment with a final temperature of less than about 550° C. or 550° C. or more, respectively. The film is heat-treated preferably at 300° C. to 550° C., more preferably at 350° C. to 500° C., when one desires to obtain an amorphous silicon film. When the final temperature is less than 300° C., the silicon compound is not completely decomposed by heat to fail in obtaining a silicon film having a sufficient thickness. It is preferable to apply the heat treatment in an inert gas atmosphere such as nitrogen, helium and argon, or in an atmosphere in which a reducing gas such as hydrogen is mixed. The amorphous silicon film may be converted into a polycrystalline silicon film by irradiating a laser beam to the amorphous silicon film, if it is desirable. An atmosphere not containing oxygen, for example an atmosphere in nitrogen, helium or argon, or an atmosphere in which a reducing gas such as hydrogen is mixed, is preferably used for laser irradiation.

On the other hand, the coating film of the silicon compound may be subjected to a light irradiation treatment before removing the solvent in an inert atmosphere. The silicon compound soluble in a solvent is not only converted into a tough and solvent insoluble coating film by the light irradiation treatment but also is converted into a silicon film having excellent photoelectric characteristics by the light irradiation treatment, or by a heat treatment simultaneously applied with the light irradiation treatment.

The light source to be used for the light irradiation treatment for converting the silicon compound into the silicon film include a mercury lamp, deuterium lamp or an electric discharge light from a rare gas such as argon, krypton and xenon, as well as a YAG laser, argon laser, carbon dioxide laser, and eximer laser such as XeF, XeCl, XeBr, KrCl, ArF and ArCl lasers. While these light sources have in general an output power of 10 to 5000 W, an output power of 100 to 1000 W may be sufficient. While the wavelength of these light sources is not restricted provided that the light is absorbed by the silicon compound to some extent it is usually in the range of 170 nm to 600 nm, and a wavelength of 170 nm to 380 nm is particularly preferable from the point of absorption efficiency. Use of the laser light is particularly preferable from the point of conversion efficiency to the polycrystalline silicon. The temperature for the light irradiation treatment is usually from room temperature to 500° C., but the temperature may be appropriately selected depending on the characteristics of the silicon film obtained as a semiconductor.

The concentration of the silicon compound solution is about 1 to 80% by weight in the present invention, which may be adjusted depending on the desired thickness of the silicon film. When the concentration exceeds 80%, a uniform coating film cannot be obtained because the solute is liable to precipitate.

A trace amount of a fluorine based, silicon based or nonionic surface tension adjusting agent may be added in the solution within a range not compromising objective functions. The nonionic surface tension adjusting agent makes wettability of the solution to the coating object good, improves leveling properties of the coating film, and serves for preventing granular or rough surface of the coating film from generating.

The nonionic surface active agents as described above include a fluorine based surface active agent, a fluorine based surface active agent containing a fluorinated alkyl group or perfluoroalkyl group, or a polyetheralkyl based surface active agent having an oxyalkyl group. Examples of the fluorine based surface active agents include $C_9F_{19}CONHC_{12}H_{25}$, $C_8F_{17}SO_2NH-(C_2H_4O)H$, $C_9F_{17}O$ (Pullronick L-35)$C_9F_{17}$, $C_9F_{17}O$(Pullronick P-84)$C_9F_{17}$, and $C_9F_{17}O$(Tetronic-704)$(C_9F_{17})_2$, wherein Pullronick-L-35 is a polyoxypropylene-polyoxyethylene block copolymer with a mean molecular weight of 1,900 made by Asahi Electrochemical Co.; Pullronick P-84 is a polyoxypropylene-polyoxyethylene block copolymer with a mean molecular weight of 4,200 made by Asahi Electrochemical Co.; and Tetronic-704 is a N,N,N',N'-tetrakis (polyoxypropylene-polyoxyethylene) block copolymer with a mean molecular weight of 5,000 made by Asahi Electrochemical Co.

Examples of the fluorine based surface active agent include F-TOP EF301, EF303 and EF352 (made by Shin-Akita Chemicals Co.), Megafax F171 and F173 (made by Dainihon Ink Co.), Ashahi Guard AG710 (made by Asahi Glass Co.), Florade FC170C, FC430 and FC431 (made by Sumitomo MIM Co.), Surflon S382, SC101, SC102, SC103, SC104, SC105 and SC106 (made by Asahi Glass Co.), BM1000 and 1100 (made by M-Chemie Co.), and Schsego-Fluor (made by Schwegmann Co.).

Examples of the polyetheralkyl based surface active agent include polyoxyethylene alkylether, polyoxyethylene allylether, polyoxyethylene alkylphenolether, polyoxyethylene fatty acid ester, sorbitane fatty acid ester, polyoxyethylene sorbitane fatty acid ester, and oxyethylene-propylene block polymer.

Examples of these polyetheralkyl based surface active agent include Emargen 105, 430, 810 and 920, Leodol SP40S and TW-L120, Emanol 3199 and4110, Exel P-40S Bridge 30, 52, 72 and 92, Arassel 20, Emasol 320, Tween 20 and 60, Marge 45 (all of them are made by Kao Co.), and Nonipol 55 (made by Sanyo Chemicals Co.). The nonionic surface active agent other than those described above are, for example, polyoxyethylene fatty acid ester, polyoxyethylene sorbitane fatty acid ester, and polyaalkyleneoxide block copolymer, and example of them include Chemistatt 2500 (made by Sanyo Chemicals Co.), SN-EX9228 (made by Sun-Nobuko Co.), and Nonal 530 (made by Toho Chemical Industries, Co.). These nonionic surface active agents are used preferably in an amount of 0.01 to 10 parts by weight, in particular in an amount of 0.1 to 5 prts by weight, relative to 100 parts by weight of the combined amount of the components (a) and (b). The amount of 0.01 parts by weight is not preferable since the effect of the nonionic surface active agent is not displayed, while the amount of exceeding 10 parts by weight is also not preferable since the composition readily foams besides causing color change by heating.

The viscosity of the silicon compound solution prepared is usually within a range of 1 to 100 Pa·S, and can be appropriately selected depending on the purpose of coating and thickness of the coating film. A viscosity of more than 100 Pa·S makes a uniform coating film difficult to obtain.

While the substrate to be used is not particularly restricted, conventional quartz, borosilicate glass and soda glass, as well as a transparent electrode such as ITO, metallic substrate such as gold, silver, copper, nickel, titanium, aluminum and tungsten, and a glass or plastic substrate comprising these metals on the surface, may be used.

The insulation film is formed using the liquid material in the present invention, so far as it is possible. The liquid material that can be used for forming the insulation film includes polysilazane and SOG. Polysilazane has an Si—N—Si bond, and SOG has an Si—O—Si bond, and both substances may be coated on the substrate to form the coating film by the spin-coat method, roll-coat method, curtain coat method, dip-coat method, spray method and ink-jet method. The method for forming the coating film can be selected depending on the thickness and uniformity of the coating film, and the size and shape of the substrate. While an insulation film having better quality may be obtained as the heat treatment temperature after forming the coating film is higher, the temperature is appropriately selected considering heat resistance of the substrate used, and process conditions of the semiconductor device. Using polysilazane can afford an insulation film having a better film quality than using SOG, when the heat treatment temperature is relatively as low as 300 to 500° C. The insulation film may be formed on the surface of the substrate by dipping the substrate in the liquid material. For example, an $SiO_2$ film can be formed on the substrate by dipping the substrate in an aqueous fluorosilicic acid solution and adding boric acid in the aqueous solution, as disclosed in Japanese Unexamined Patent Application Publication No. 5-259154. When the performance of the thin film transistor is remarkably influenced by the film quality of the gate insulation film determined by the heat treatment temperature in manufacturing the semiconductor device, the insulation film may be formed by the conventional film deposition method using an evacuation apparatus, or by heat oxidation.

The conductive film is formed using the liquid material in the present invention, so far as it is possible. The conductive film is formed using the liquid material by a method comprising forming a coating film on the substrate by spin-coating, and heat-treating the coating film for converting into a conductive film; or a method for forming the conductive film on the surface of the substrate by dipping the substrate in the liquid material. A suspension solution prepared by dispersing metal fine particles in an organic solution, or a solution prepared by dissolving an organic acid containing a metal in a solvent, may be used as the liquid material to be used in the method using the coating film. The suspension solution usually contains fine particles of a noble metal for forming a metallic film of Au or Ag. The organic acid solution containing In and Sn can be used for forming the ITO film. The dipping method available include the so-called plating method, which can be used for forming metallic films of Ni, Cu or Au. For securing contact resistance between the conductive film and electrodes or source/drain regions of the thin film transistor in forming the conductive film, the sputtering method as a conventional film deposition method, or a combination of the sputtering method and the liquid material may be used for forming the conductive film.

The present invention will be described in detail hereinafter with reference to the examples.

EXAMPLE 1

Figure 4:
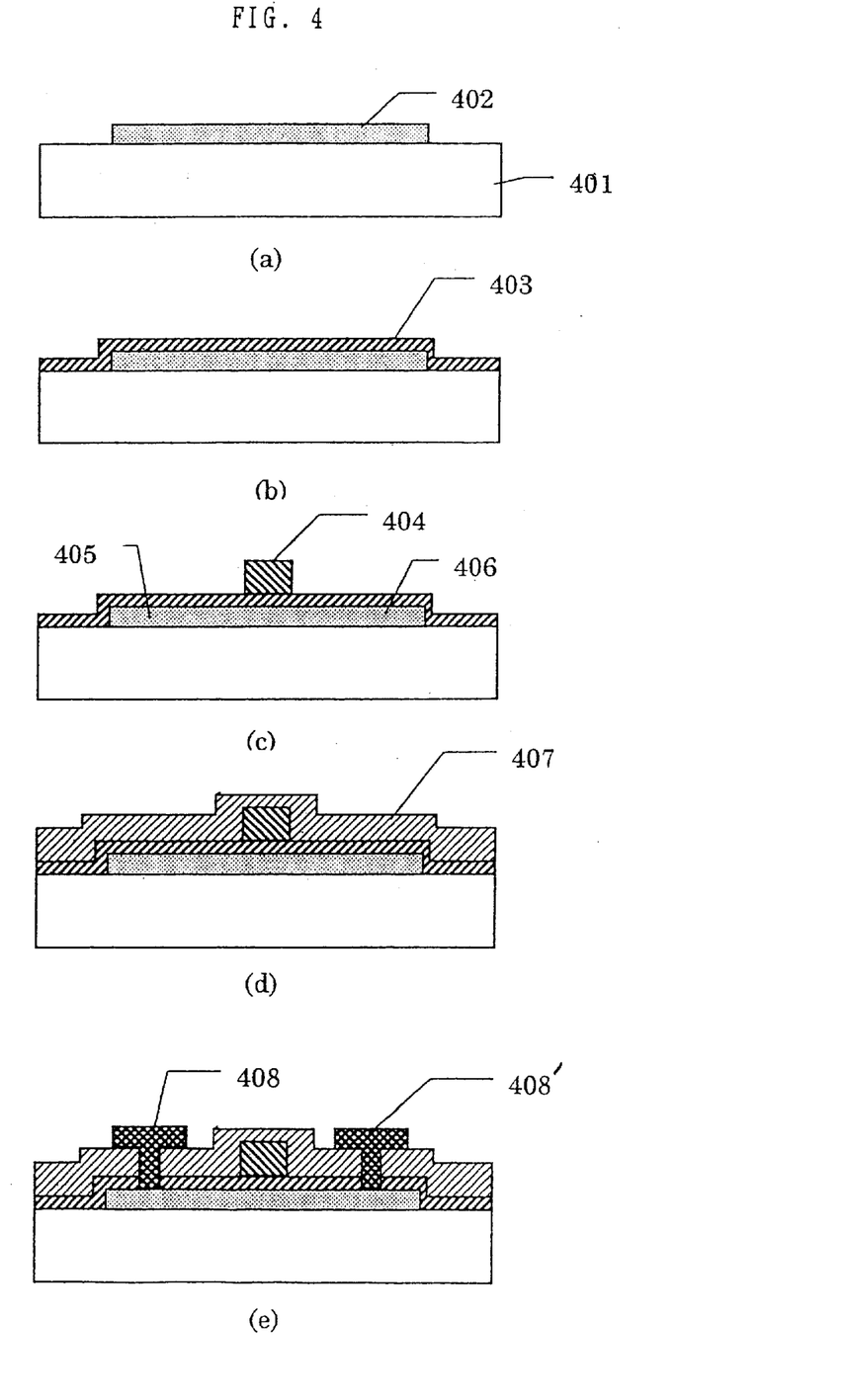
FIGS. 4(a)–(e) are cross sections sowing a manufacturing process of a co-planar type thin film transistor according to Example 1 of the present invention.

Example 1 of the present invention is shown in FIG. 4. The method for manufacturing a co-planar type thin film transistor is shown in FIG. 4 in the order of its manufacturing steps.

FIGS. 4(a)–(e), a coating film was at first formed on a glass substrate 401 at a rotational speed of 500 rpm using 5% solution of a mixture of cyclopentasilane and cyclohexasilane as the silicon compound in benzene as a solvent. Then, after removing the solvent in the coating film by heat-treating at 100° C. for 30 minutes, a thin film containing silicon with a thickness of 50 nm is formed by heat-treating at 400° C. for 30 minutes. Subsequently, a laser beam with an energy density of 250 mJ/cm$^2$ was irradiated onto the thin film to form a polycrystalline silicon film. The steps from forming the coating film to laser irradiation were performed in an Ar gas atmosphere containing 1 ppm or less of oxygen. The coating film was formed and heat-treated in a glove box whose atmosphere had been controlled, and the laser beam was irradiated through a quartz glass window to the glass substrate placed in a sealed vessel provided with the quartz glass window and having the same atmosphere as that in the glove box. The glass substrate was taken out of the glove box into the air, followed by forming an islet region 402 to serve as source, drain and channel regions by photo-etching as shown in FIG 4(a).

An insulation film 403 was formed in the next step using the liquid material. In this example, 5% concentration of Polysilazane in xylene as a solvent was coated on the substrate at a rotational speed of 200 rpm to form a coating film with a thickness of about 1200 Å. Then, the solvent was removed by baking the coating film at 80° C. for 30 minutes, and the coating film was converted into an SiO$_2$ film by heat-treating at 350° C. for 60 minutes to form a gate insulation film 403 as shown in FIG. 4(b). Although the insulation film was heat-treated at 350° C., electrical characteristics of the gate insulation film as well as MOS interface characteristics are improved, thus improving reliability of the thin film transistor, when the coating film is heat-treated in an atmosphere containing oxygen and water vapor.

Subsequently, a gate electrode 404 was formed using the liquid material. A solution of 8% concentration of an organic compound containing indium and tin in xylene as a solvent was used in this example. A coating film was formed on the substrate at a rotational speed of 1500 rpm, followed by removing the solvent by a heat-treatment at 80° C., and an ITO film with a thickness of 2000 Å was formed by heat-treating at 300° C. A gate electrode 404 as shown in FIG. 4(c) was obtained by photo-etching.

Subsequently, source/drain regions 405 and 406 were formed by an ion-implantation method using the gate electrode 404 as a mask. The conditions for ion-implantation were an implantation energy of phosphorous of 70 KeV and an implantation density of $1 \times 10^{15}$/cm$^2$. The ion-implantation was carried out while the photoresist used for forming the gate electrode was left behind on the ITO film.

The source/drain regions above may be formed without using the ion-implantation method. The gate insulation film on the source/drain regions are at first removed using the gate electrode 404 as a mask in the structure shown in FIG. 4(c). Then, a SOG-PSG film is formed by coating, and the film is annealed with a laser beam after removing the solvent in the SOG-PSG film and compacting it by a heat-treatment. The source/drain regions are formed by allowing phosphorous in the PSG film to diffuse into the silicon film as a lower layer. The SOG-PSG film may be removed thereafter, or may be remained to utilize it as a part of an interlayer insulation film.

The interlayer insulation film 407 was formed in the next step using polysilazane as shown in FIG. 4(d). A polysilazane solution with a concentration of 10% was coated on the substrate at a rotational speed of 1000 rpm to form a coating film. Then, xylene as a solvent was removed by baking at 80° C., and an SiO$_2$ film with a thickness of about 5000 Å was formed by heat-treating at 350° C. While the heat-treatment at 350° C. was carried out in an atmosphere containing oxygen, electrical characteristics and reliability as an insulation film may be further improved by heat-treating in an atmosphere containing oxygen and water vapor.

An electrode layer was formed thereafter using the liquid material as shown in FIG. 4(e), after opening contact holes on the interlayer insulation film 407. A suspension solution prepared by dispersing metal fine particles with a diameter of several tens angstrom in an organic solvent was used in this example. A coating film was formed by coating the suspension solution on the substrate, and the coating film was converted into a conductive film by heat-treating at 200° C. after removing the solvent. Finally, electrodes 408 and 408 were formed by patterning as shown in FIG. 4(e).

EXAMPLE 2

Example 2 in the present invention is shown in FIGS. 5(a)–(e). FIGS. 5(a)–(e) show one example of the manufacturing process of a stagger type thin film transistor.

In FIG. 5(a), the reference numeral 501 denotes a glass substrate, the reference numerals 502 and 502' denote silicon films to serve as source/drain regions in which impurities are doped. A solution with a viscosity of 8 mPa·s prepared by dissolving 2 g of 1,1'-bis (cyclohexasilane) in 10 g of toluene was spin-coated on a glass substrate 501 under an argon atmosphere, and the coating film was heat-treated at 450° C. in argon after drying at 150° C. to form a metallic silicon film with a thickness of 65 nm. Then, the film was annealed with a laser having an energy density of 300 mJ/cm$^2$ to form a polycrystalline silicon film. Phosphorous ions were injected into the polycrystalline silicon film by ion-implantation, and source/drain regions 502 and 502' were formed by patterning as shown in FIG. 5(a).

The order of the laser annealing step and the ion-implantation step and may be reversed, i.e. the ions are implanted at first and then annealed with a laser. When the steps arc in this order, the implanted ions may be activated simultaneously with crystallization of the silicon film.

Otherwise, the ion-implantation method may be omitted by taking advantage of a PSG film in forming the silicon film in which impurities to serve as the source/drain regions are doped. After forming the polycrystalline silicon film from the coating film of the silicon compound as described above, a SOG-PSG film is formed by coating, the solvent in the SOG-PSG film is removed by heat-treatment, and the remaining film is subjected to laser annealing. Phosphorous in the PSG film diffuses into the silicon film at the lower layer, thereby the silicon film in which impurities are doped can be formed. The excess SOG-PSG film is removed thereafter to obtain a structure shown in FIG. 5(a). The laser annealing step may be applied after forming the SOG-PSG film, after forming the coating film of the silicon compound and removing the solvent.

Figure 5:
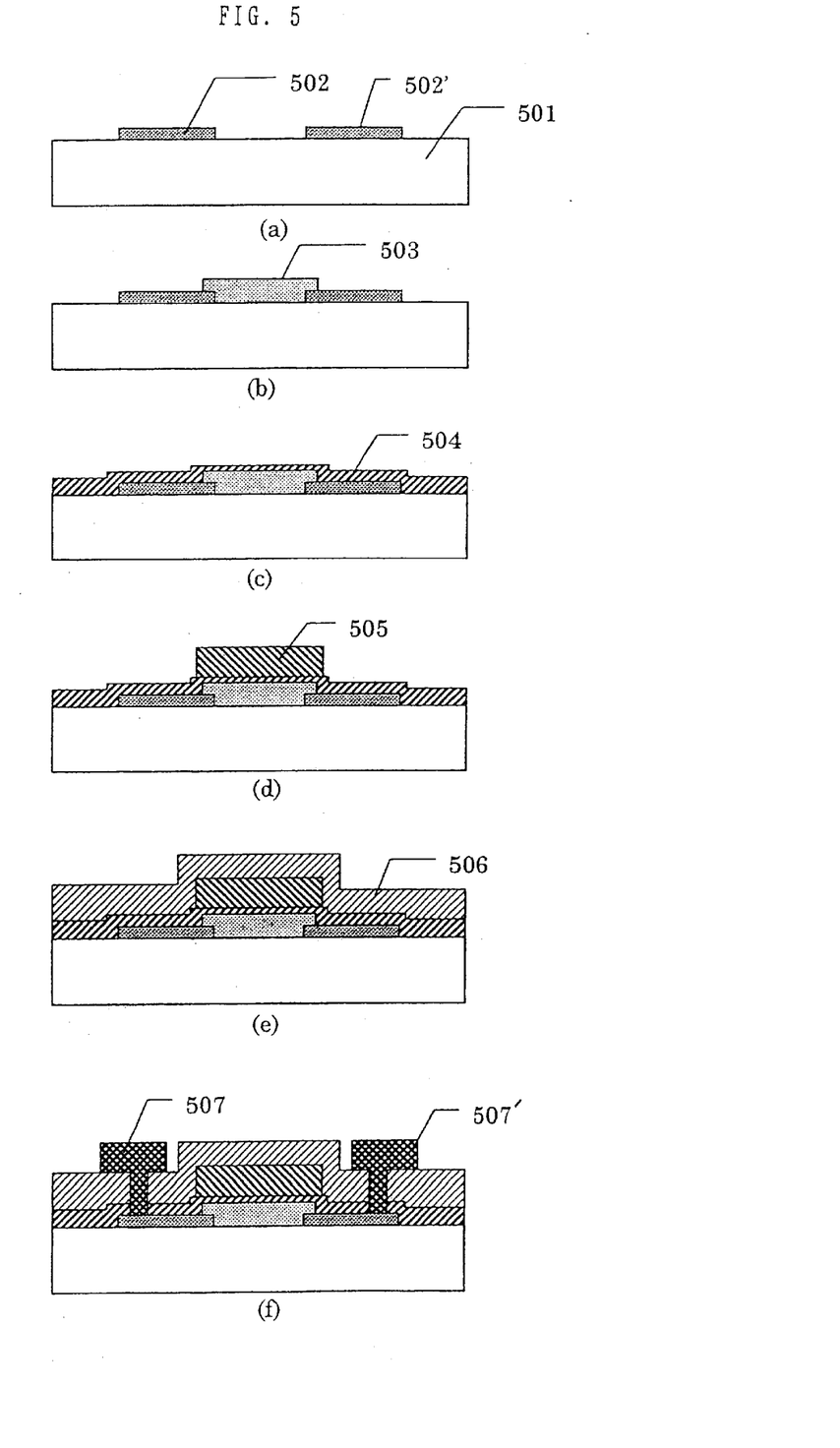
FIGS. 5(a)–(e) are cross sections showing a manufacturing process of a stagger type thin film transistors, according to Example 2 of the present invention.

Subsequently, the silicon film 503 to serve as a channel region was formed as shown in FIG. 5(b). At first, a solution with a viscosity of 7 mPa·s was prepared by dissolving 2 g of silylcyclopentasilane in 10 g of toluene, and then the solution was spin-coated on the substrate under an argon atmosphere followed by drying at 150° C. Then, the coated film was decomposed by heating at 450° C. in argon containing 3% of hydrogen to form a metallic silicon film with a thickness of 50 nm. Then, the silicon film was annealed with a laser to form a polycrystalline silicon film. An islet region 503 to serve as a channel region for connecting to the source/drain regions was formed by photo-etching as shown in FIG. 5(*b*).

In the next step, a gate insulation film 504 is formed with the liquid material as shown in FIG. 5(*c*). At first, a polysilazane solution with a concentration of 5% is coated on the substrate at a rotational speed of 2000 rpm to form a coating film with a thickness of 1200 Å. Then, a gate insulation film 504 was formed by modifying the coating film to a $SiO_2$ film by heat-treating the coating film at 350° C. for 30 minutes.

In the next step, a gate electrode 505 is formed with the liquid material as shown in FIG. 5(*d*). At first, a coating film is formed on the substrate at a rotational speed of 1500 rpm using a solution of an organic compound containing indium and tin with a concentration of 8% in xylene. Then, the solvent was removed by heat-treatment at 80° C., followed by heat-treatment at 300° C. to form an ITO film with a thickness of 2000 Å. Then, a gate electrode 505 was formed as shown in FIG. 5(*d*) by photo-etching. After the heat-treatment at 300° C. for 30 minutes, the substrate was taken out in the air after subsequently cooling the substrate to 200° C. in a reducing atmosphere of hydrogen to form the ITO film having a low resistively.

In the next step, an interlayer insulation film 506 is formed using the liquid material as shown in FIG. 5(*e*). A coating film is at first formed by coating a solution with a concentration of 10% on the substrate at a rotational speed of 1000 rpm. Then, xylene as a solvent was removed by baking at 80° C., followed by heat-treating at 350° C. to obtain a $SiO_2$ film with a thickness of about 5000 Å.

After opening contact holes on the interlayer insulation film 506 as shown in FIG. 5(*f*), electrodes 507 and 507' were formed using the liquid material. The electrodes were formed using the ITO film in this example. Using a solution of an organic compound containing indium and tin with a concentration of 8% in xylene as a solvent, a coating film is formed on the substrate at a rotational speed of 1500 rpm. Then, the solvent is removed by a heat-treatment at 300° C. to form the ITO film with a thickness of about 2000 Å. Finally, the electrodes 507 and 507' as shown in FIG. 5(*f*) were formed by photo-etching.

EXAMPLE 3

Figure 6:
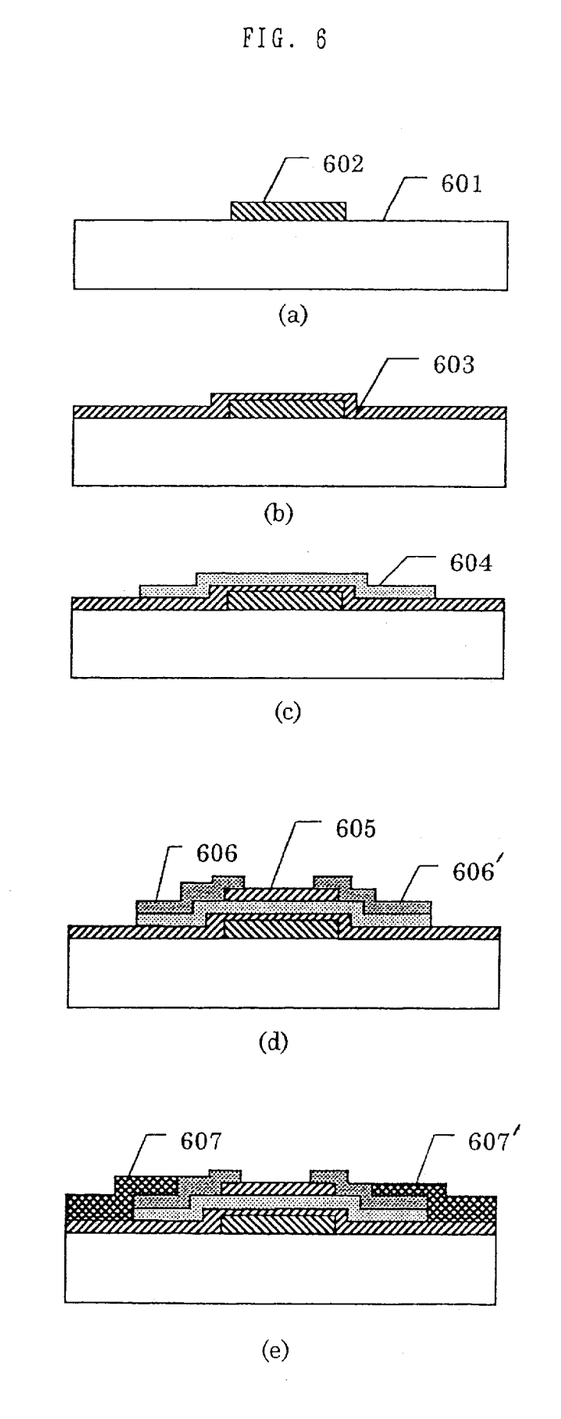
FIGS. 6(a)–(e) are cross sections showing a manufacturing process of a reversed stagger type thin film transistor according to Example 3 of the present invention.

Example 3 of the present invention is shown in FIGS. 6(*a*)–(*e*). FIGS. 6(*a*)–(*e*) show one example of the manufacturing process of a reversed stagger type thin film transistor. A gate electrode 602 is at first formed on a glass substrate 601 as shown in FIG. 6(*a*). A gate electrode was formed by an electroless plating in this example. Using a sodium-free nickel plating solution, a nickel film with a thickness of about 4000 Å was formed on the substrate. While the nickel film is grown by allowing nickel to precipitate by dipping the substrate in the plating solution, an activator treatment is applied for cleaning the substrate as a pre-treatment step. Although a solution containing sodium is usually used in the pre-treatment, a sodium-free solution was used for the pre-treatment in the present invention. The nickel film was patterned by a conventional photo-etching using a mixed solution of nitric acid and glacial acetic acid as an etching solution.

A gate insulation film 603 was formed as shown in FIG. 6(*b*) using the liquid material. Polysilasane solution with a concentration of 5% is at first coated on the substrate at a rotational speed of 2000 rpm to form a coating film with a thickness of about 1200 Å. Then, the solvent in the coating film was removed by heat-treating at 80° C., followed by heat-treating at 350° C. to convert the coating film into an $SiO_2$ film to form a gate insulation film 603.

Subsequently, a silicon film 604 that serves as a channel layer is formed using the liquid material as shown in FIG. 6(*c*). A coating solution with a viscosity of 10 mPa·s is at first prepared by dissolving 2 g of hexasilaprisman (compound I) in 10 g of toluene, and a coating film is formed by spin-coating this solution on the substrate under an argon atmosphere containing 3% of hydrogen. Then, the coating solution was irradiated with UV light from a 500 W high-pressure mercury-vapor lamp for five minutes to change the coating film to a solid film comprising polyhydrosilane. This solid film is subsequently heated at 500° C. in argon containing 3% of hydrogen to form a metallic silicon film with a thickness of 50 nm. Then, the film was annealed with a laser having an energy density of 250 m/cm$^2$ to crystallize the silicon film into a polycrystalline silicon film.

In the next step, an insulation film 605 that serves as a channel protective film, and a silicon film 606 and 606' doped with impurities that serves as source/drain regions are formed using the liquid material as shown in FIG. 6(*d*). The channel protective film can be formed using, for example, polysilazane as in forming the gate electrode. The silicon film doped with impurities that serves as the source/drain regions may be formed by the same method as forming the source/drain regions shown in FIG. 5(*a*). The film was formed by a method not using ion-implantation in this example. In other words, after forming the silicon film from a coating film of the silicon compound, the SOG-POG film was formed by coating, and the solvent was removed by heat-treatment, followed by annealing the film with a laser. Phosphorous in the POG film diffused into the silicon film as a lower layer. The excess SOG-PSG film is removed thereafter to obtain the structure shown in FIG. 6(*d*). The laser annealing step may be applied after removing the solvent from the coating film of the silicon compound, and after forming the SOG-POG film.

Subsequently, electrodes 607 and 607' are formed from the liquid material as shown in FIG. 6(*e*). An ITO film was formed as an electrode in this example. Using a 8% solution of an organic compound containing indium and tin in xylene as a solvent, a coating film is formed on the substrate at a rotational speed of 1500 rpm. Then, the solvent is removed by heat-treating at 80° C., and the ITO film with a thickness of about 2000 Å was formed by heat-treating at 300° C. Subsequently, electrodes 607 and 607' were obtained as shown in FIG. 6(*e*) by photo-etching. The substrate was taken out into the air after cooling the substrate at about 150° C. in a reducing atmosphere containing hydrogen, after heat-treating at 300° C. for 30 to 60 minutes, in order to reduce resistivity of the ITO film. The electrode formed using ITO is a transparent electrode, which may be used as pixels required in a liquid crystal display device.

Industrial Applicability

All or a part of each thin film of the silicon film, insulation film and conductive film constituting the thin film transistor according to the present invention are formed using the liquid materials. The principal method comprises forming coating films by coating the liquid materials on a substrate, and forming desired thin films by heat-treating the coating films. Accordingly, intrinsic problems in the conventional film deposition methods such as the CVD method and sputtering method can be solved, enabling the thin film transistor using a compact and cheap apparatus by forming the thin films with high productivity, small incidence of film defects, high manufacturing yield and good coverage at the steps.

What is claimed is:

1. A method for manufacturing a thin film transistor comprising a silicon film, a gate insulation film, a gate electrode conductive film, an interlayer insulation film, and a thin film for electrodes and wiring lines, the silicon film being formed by steps comprising:

forming a coating film by applying a liquid material containing silicon atoms; and at least one of heat-treating and irradiating a light for converting the coating film into the silicon film.

2. A method for manufacturing a thin film transistor comprising a silicon film, a gate insulation film, a gate electrode conductive film, an interlayer insulation film, a thin film for electrodes and wiring lines, and a transparent conductive film, the silicon film being formed by steps comprising:

forming a coating film by applying a liquid material containing silicon atoms; and at least one of heat-treating and irradiating a light for converting the coating film into the silicon film.

3. A method for manufacturing a thin film transistor, comprising steps of:

forming a coating film by applying a liquid material containing silicon atoms on an insulation substrate or insulation film;

at least one of heat-treating and irradiating a light for converting the coating film into a silicon film;

forming an islet region to serve as sources, drains and channels by patterning the silicon film;

forming a gate insulation layer;

forming a gate electrode;

injecting impurities into source/drain regions;

forming an interlayer insulation film;

opening contact holes on the interlayer insulation film; and forming electrodes and wiring lines.

4. A method for manufacturing a thin film transistor, comprising steps of:

forming a semiconductor layer containing impurities that serves as source/drain regions on an insulation substrate or insulation film;

forming a coating film by applying a liquid material containing silicon atoms on the substrate;

at least one of heat-treating and irradiating a light for converting the coating film into a silicon film;

forming an islet region to serve as a channel region to be connected to the source/drain regions by patterning the silicon film;

forming a gate insulation film;

forming a gate electrode;

forming an interlayer insulation film;

opening contact holes on the interlayer insulation film; and forming electrodes and wiring lines.

5. A method for manufacturing a thin film transistor, comprising steps of:

forming a gate electrode on an insulation substrate or insulation film;

forming a gate insulation film;

forming a coating film by applying a liquid material containing silicon atoms on a substrate;

at least one of heat-treating and irradiating a light for converting the coating film into a silicon film;

forming a semiconductor layer containing impurities that serves as source/drain regions; and forming electrodes and wiring lines.

6. A method for manufacturing a thin film transistor comprising a silicon film, a gate insulation film, a gate electrode conductive film, an interlayer insulation film for electrodes and wiring lines, the silicon film being formed by steps comprising:

forming a coating film by applying a liquid material containing silicon atoms;

at least one of heat-treating and irradiating a light to convert the coating film into an amorphous silicon film; and at least one of heat-treating and irradiating a light to convert the amorphous silicon film into a polycrystalline silicon film.

7. A method for manufacturing a thin film transistor, comprising a silicon film, a gate insulation film, a gate electrode conductive film, an interlayer insulation film for electrodes and wiring lines, the silicon film beings formed by steps comprising:

forming a coating film by applying a liquid material containing silicon atoms;

irradiating a light to convert the coating film into an amorphous silicon film; and at least one of heat-treating and irradiating a light to convert the amorphous silicon film into a polycrystalline silicon film.

8. The method for manufacturing a thin film transistor according to claim 6, the heat-treatment step to convert the coating film into an amorphous silicon film comprising:

removing a solvent contained in the coating film formed with the liquid material containing silicon atoms; and converting the coating film into an amorphous silicon film by heat-treating at a temperature higher than the temperature in the step for removing the solvent.

9. The method for manufacturing a thin film transistor according to claim 6, the heat-treatment step to convert the amorphous silicon film into a polycrystalline silicon film comprising heat-treating such as lamp annealing or laser annealing.

10. The method for manufacturing a thin film transistor according to claim 9, the heat-treatment step using an intense light such as a lamp or a laser being carried out in an atmosphere containing no oxygen.

11. The method for manufacturing a thin film transistor according to claim 5, the step for forming the gate insulation film comprising:

coating the substrate with polysilazane, and converting coated polysilazane into an $SiO_2$ film by heat-treatment.

12. The method for manufacturing a thin film transistor according to claim 5, the step for forming the gate electrode comprising:

forming a coating film by applying a liquid material containing a metal on the substrate;

converting the coating film into a metal film by heat-treatment; and patterning the metal film.

13. The method for manufacturing a thin film transistor according to claim 5, the step for forming the gate electrode comprising:

forming a metal film on the substrate by plating; and patterning the metal film.

14. The method for manufacturing a thin film transistor according to claim 5, the step for forming the gate electrode comprising:

forming a coating film by applying a compound containing indium and tin on the substrate; and heat-treating the coating film for converting into an film.

15. The method for manufacturing a thin film transistor according to claim 3, the step for forming the interlayer insulation film comprising:

coating polysilazane on the substrate; and converting polysilazane into an $SiO_2$ film by heat-treatment.

16. The method for manufacturing a thin film transistor according to claim 5, the step for forming the electrodes and wiring lines comprising:

forming a coating film by applying a liquid material containing a metal on a substrate;

converting the coating film into a metal film by heat-treatment; and patterning the metal film.

17. The method for manufacturing a thin film transistor according to claim 5, the step for forming the electrodes and wiring lines comprising:

forming a metal film on a substrate by plating; and patterning the metal film.

18. The method for manufacturing a thin film transistor according to claim 5, the step for forming the electrodes and wiring lines comprising:

forming a coating film by applying a compound containing indium and tin on the substrate; and heat-treating for converting the coating film into an film.

19. The method for manufacturing a thin film transistor according to claim 2, further comprising a step for forming the transparent substrate comprising:

forming a coating film by applying a compound containing indium and tin on the substrate; and heat-treating for converting the coating film into an film.

20. The method for manufacturing a thin film transistor according to claim 5, the liquid material containing silicon atoms containing a silicon compound having a cyclic group represented by a general formula of $Si_nX_m$ (wherein n represents an integer of 5 or more, m represents an integer of n, 2n−2 or 2n, and X represents a hydrogen atom and/or a halogen atom).

21. The method for manufacturing a thin film transistor according to claim 20, n being an integer in a range of 5 or more and 20 or less in the silicon compound having a cyclic group represented by the general formula of $Si_nX_m$.

22. The method for manufacturing a thin film transistor according to claim 20, a solute concentration of a solution containing the silicon compound having a cyclic group represented by the general formula of $Si_nX_m$ being in the range of 1 to 80% by weight.

23. The method for manufacturing a thin film transistor according to claim 20, a solution containing the silicon compound having a cyclic group represented by the general formula of $Si_nX_m$ having a viscosity of 1 to 100 mPa·s.

24. The method for manufacturing a thin film transistor according to claim 20, a solution containing the silicon compound having a cyclic group represented by the general formula of $Si_nX_m$ having a vapor pressure of 0.001 to 100 mmHg at room temperature.

25. The method for manufacturing a thin film transistor according to claim 20, hydrocarbons being used for a solvent for a solution containing the silicon compound having a cyclic group represented by the general formula of $Si_nX_m$.

26. A method for manufacturing a thin film transistor comprising thin films of a silicon film, a gate insulation film, a gate electrode conductive film, an interlayer insulation film, and a conductive film for electrodes and wiring lines, the method comprising:

forming all of the thin films using liquid materials, no evacuation apparatus being used for forming all of the thin films.

27. A method for manufacturing a thin film transistor comprising thin films of a silicon film, a gate insulation film, a gate electrode conductive film, an interlayer insulation film, a conductive film for electrodes and wiring lines, and a transparent conductive film, the method comprising:

forming all of the thin films using liquid materials, no evacuation apparatus being used for forming all of the thin films.

28. A method for manufacturing a thin film transistor, comprising a step of:

forming a coating film by applying a solution of a compound containing silicon atoms.

29. A method for manufacturing a thin film, comprising steps of:

forming a coating film by applying a solution of a compound containing silicon atoms; and at least one of heat-treating and irradiating a light to convert the coating film into a silicon film.

30. A method for manufacturing a thin film transistor, comprising steps of:

forming a coating film by applying a solution of a compound containing silicon atoms;

at least one of heat-treating and irradiating a light to convert the coating film into an amorphous silicon film; and at least one of heat-treating and irradiating a light to convert the amorphous silicon film into a polycrystalline silicon film.

31. The method for manufacturing a thin film transistor according to claim 28, the compound containing silicon atoms being a compound including a cyclic moiety containing silicon atoms.

32. The method for manufacturing a thin film transistor according to claim 28, the compound containing silicon atoms being a compound including a cyclic silicon-atom-containing moiety, hydrogen atoms, and halogen atoms.

33. The method for manufacturing a thin film transistor according to claim 28, the compound containing silicon atoms being a compound including a cyclic silicon-atom-containing moiety and hydrogen atoms.

34. A method for manufacturing a thin film, comprising steps of:

forming a coating film by applying a solution of a compound containing silicon atoms;

irradiating a light to convert the coating film into an amorphous silicon film; and at least one of heat-treating and irradiating a light to convert the amorphous silicon film into a polycrystalline silicon film.

35. A method for manufacturing a thin film transistor, comprising steps of:
   forming a coating film by applying a solution of a compound containing silicon atoms;
   at least one of heat-treating and irradiating a light to convert the coating film into an amorphous silicon film; and
   irradiating a light to convert the amorphous silicon film into a polycrystalline silicon film.

36. A method for manufacturing a thin film transistor comprising a silicon film, a gate insulation film, a gate electrode conductive film, an interlayer insulation film for electrodes and wiring lines, the silicon film being formed by steps comprising:
   forming a coating film by applying a liquid material containing silicon atoms;
   irradiating a light with a wavelength of 170 nm to 380 nm to convert the coating film into an amorphous silicon film; and
   at least one of heat-treating and irradiating a light to convert the amorphous silicon film into a polycrystalline silicon film.

* * * * *

UNITED STATES PATENT AND TRADEMARK OFFICE
CERTIFICATE OF CORRECTION

PATENT NO. : 6,514,801 B1
DATED : February 4, 2003
INVENTOR(S) : Ichio Yudasaka et al.

It is certified that error appears in the above-identified patent and that said Letters Patent is hereby corrected as shown below:

<u>Title page,</u>
Item [86], please change "PCT No.: PCT/JP00/09185" to -- PCT No.: PCT/JP00/01985 --.

Signed and Sealed this

Twenty-second Day of July, 2003

JAMES E. ROGAN
*Director of the United States Patent and Trademark Office*